United States Patent
Griswold et al.

(10) Patent No.: US 11,875,509 B2
(45) Date of Patent: Jan. 16, 2024

(54) SYSTEM AND METHOD FOR DETERMINING UNDERSAMPLING ERRORS FOR A MAGNETIC RESONANCE FINGERPRINTING PULSE SEQUENCE

(71) Applicant: Case Western Reserve University, Cleveland, OH (US)

(72) Inventors: Mark A. Griswold, Shaker Heights, OH (US); Dan Ma, Solon, OH (US); Debra McGivney, Bay Village, OH (US); Rasim Boyacioglu, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 472 days.

(21) Appl. No.: 17/301,492

(22) Filed: Apr. 5, 2021

(65) Prior Publication Data
US 2021/0312626 A1    Oct. 7, 2021

Related U.S. Application Data

(60) Provisional application No. 63/004,932, filed on Apr. 3, 2020.

(51) Int. Cl.
*G06T 7/00* (2017.01)
*G06T 7/11* (2017.01)
(Continued)

(52) U.S. Cl.
CPC .......... *G06T 7/0014* (2013.01); *G01R 33/445* (2013.01); *G01R 33/4625* (2013.01);
(Continued)

(58) Field of Classification Search
CPC ............... G06T 7/0014; G06T 7/11; G06T 2207/10088; G06T 2207/30016;
(Continued)

(56) References Cited

U.S. PATENT DOCUMENTS

| 8,723,518 B2 | 5/2014 | Seiberlich |
| 11,125,847 B2 * | 9/2021 | Eck .................... G01R 33/4824 |

(Continued)

OTHER PUBLICATIONS

Cohen O. et al. "Algorithm comparison for schedule optimization in MR fingerprinting," Magn. Reson. Imaging, vol. 41, pp. 15-21, 2017.
(Continued)

*Primary Examiner* — Santiago Garcia
(74) *Attorney, Agent, or Firm* — Quarles & Brady LLP

(57) ABSTRACT

A method for determining an undersampling error for a magnetic resonance fingerprinting (MRF) pulse sequence includes retrieving a plurality of sets of spatial response functions. Each set of spatial response functions is associated with a tissue type in a reference image and is based on a tissue mask of the reference image for each tissue type. A signal evolution for each tissue type may be generated based on, for example, the MRF pulse sequence, An undersampled image may be generated for each tissue type using the set of spatial response functions and the signal evolutions for the tissue type. At least one quantitative parameter may be determined by comparing an undersampled image series created from the undersampled images to an MRF dictionary. An undersampling error for the MRF pulse sequence
(Continued)

may be generated by comparing a quantitative map (or maps) for the quantitative parameter (or parameters) and the reference image.

18 Claims, 7 Drawing Sheets

(51) Int. Cl.
G01R 33/50 (2006.01)
G01R 33/48 (2006.01)
G01R 33/46 (2006.01)
G01R 33/56 (2006.01)
G01R 33/44 (2006.01)

(52) U.S. Cl.
CPC ......... *G01R 33/4824* (2013.01); *G01R 33/50* (2013.01); *G01R 33/5608* (2013.01); *G06T 7/11* (2017.01); *G06T 2207/10088* (2013.01); *G06T 2207/30016* (2013.01)

(58) Field of Classification Search
CPC .............. G01R 33/445; G01R 33/4625; G01R 33/4824; G01R 33/50; G01R 33/5608; G01R 33/58; G01R 33/56545
See application file for complete search history.

(56) References Cited

U.S. PATENT DOCUMENTS

| | | | |
|---|---|---|---|
| 2015/0137809 A1* | 5/2015 | Wollin | G01R 33/243 324/309 |
| 2015/0301141 A1* | 10/2015 | Griswold | G01R 33/5608 324/309 |
| 2018/0074145 A1* | 3/2018 | Kluge | G01R 33/4828 |
| 2018/0156882 A1* | 6/2018 | Cohen | G01R 33/5602 |
| 2018/0203081 A1* | 7/2018 | Cohen | G06N 3/08 |
| 2021/0109180 A1* | 4/2021 | Boernert | G01R 33/561 |
| 2022/0308147 A1* | 9/2022 | Chen | G06V 10/82 |

OTHER PUBLICATIONS

Fessler J.A. et al. "Nonuniform fast Fourier transforms using min-max interpolation," IEEE Trans. Signal Process., vol. 51, No. 2, pp. 560-574, 2003.

Kara, D. et al. "Understanding Error in Magnetic Resonance Fingerprinting." Diss. Case Western Reserve University. May 2018.

Ma D. et al. "Magnetic resonance fingerprinting," Nature, vol. 495, pp. 187-192, 2013.

Ma D. et al., "Optimization of MR fingerprinting sequence using a quantum inspired algorithm," in Proceedings of the 27th Annual Meeting, ISMRM, 2019, p. 4524.

Zhao, B. et al., "Optimal Experiment Design for Magnetic Resonance Fingerprinting: Cramer-Rao Bound Meets Spin Dynamics," IEEE Trans. Med. Imaging, vol. 38, No. 3, pp. 844-861, 2019.

* cited by examiner

SYSTEM AND METHOD FOR DETERMINING UNDERSAMPLING ERRORS FOR A MAGNETIC RESONANCE FINGERPRINTING PULSE SEQUENCE

CROSS-REFERENCE TO RELATED APPLICATIONS

This application is based on, claims priority to, and incorporates herein by reference in its entirety U.S. Ser. No. 63/004,932 filed Apr. 3, 2020 and entitled "Fast Approximation of Undersampling Artifacts in MR Fingerprinting."

STATEMENT REGARDING FEDERALLY SPONSORED RESEARCH OR DEVELOPMENT

This invention was made with government support under grant(s) EB026764 and NS109439 awarded by the National Institutes of Health. The government has certain rights in the invention.

BACKGROUND

Due to high cost and limited patient tolerance of magnetic resonance imaging (MRI), the MRI field is constantly searching for faster, more precise MRI exams. Acceleration in MRI is readily achieved with techniques such as undersampling and non-Cartesian sampling in k-space. One example is MR fingerprinting (MRF), which often uses a spiral trajectory with high undersampling factor. Reconstruction is often performed using the non-uniform FFT (NUFFT), including the additional steps of gridding and density compensation. As undersampling leads to dominating aliasing artifacts and can be a significant source of error, it is desirable to determine how to optimally sample both in time and space. For the simplest implementation of MRF, this means optimizing the flip angle and TR as functions of time.

Sequence optimization in MRI and MRF looks for optimal acquisition patterns with an application-specific cost function. Gaussian noise is often used to model both random noise and artifacts from undersampling, however, it is often not an accurate representation for non-Cartesian undersampling artifacts. In these cases, direct simulation of these artifacts is most accurate, however, applying gridding and NUFFT in an iterative optimization is computationally expensive and impractical for rapid sequence optimization and evaluation. With hundreds to thousands of time points in MRF, the number of gridding and NUFFT computations increase to the point where the optimization process is dominated by NUFFT calculations.

It would be desirable to provide a system and method for determining undersampling artifacts (or errors) for an MRF pulse sequence that overcome the aforementioned drawbacks.

SUMMARY OF THE DISCLOSURE

In accordance with an embodiment, a method for determining an undersampling error for a magnetic resonance fingerprinting (MRF) pulse sequence comprises retrieving a plurality of sets of spatial response functions. Each set of spatial response functions is associated with a tissue type in a region of interest of a reference image and each set of spatial response functions is based on a tissue mask of the reference image associated with the tissue type corresponding to the set of spatial response functions. The method further includes generating a plurality of signal evolutions based at least on the MRF pulse sequence where each of the plurality of signal evolutions associated with a tissue type for the region of interest in the reference image, generating an undersampled image for each tissue type using the set of spatial response functions for the tissue type and the signal evolutions for the tissue type, combining the undersampled image for each tissue to create an undersampled image series, comparing the undersampled image series to an MRF dictionary to determine at least one quantitative parameter, generating a quantitative map for the at least one quantitative parameter, and generating an undersampling error for the MRF pulse sequence by comparing the quantitative map and the reference image.

In accordance with another embodiment, a system for determining an undersampling error for a magnetic resonance fingerprinting (MRF) pulse sequence comprises includes an input configured to receive the MRF pulse sequence and a reference image, an undersampling error simulator coupled to the input and a display coupled to the undersampling error simulator and configured to display an undersampling error. The undersampling error simulator is configured to receive the MRF pulse sequence and reference image and retrieve a plurality of sets of spatial response functions. Each set of spatial response functions is associated with a tissue type in a region of interest of the reference image and each set of spatial response functions is based on a tissue mask of the reference image associated with the tissue type corresponding to the set of spatial response functions. The undersampling error simulator is further configured to generate a plurality of signal evolutions based at least on the MRF pulse sequence, each of the plurality of signal evolutions associated with a tissue type for the region of interest in the reference image, generate an undersampled image for each tissue type using the set of spatial response functions for the tissue type and the signal evolutions for the tissue type, combine the undersampled image for each tissue to create an undersampled image series, compare the undersampled image series to an MRF dictionary to determine at least one quantitative parameter, generate a quantitative map for the at least one quantitative parameter, and generate an undersampling error for the MRF pulse sequence by comparing the quantitative map and the reference image.

In accordance with another embodiment, a method for optimizing a magnetic resonance fingerprinting (MRF) pulse sequence includes retrieving a plurality of sets of spatial response functions. Each set of spatial response functions is associated with a tissue type in a region of interest of a reference image and each set of spatial response functions is based on a tissue mask of the reference image associated with the tissue type corresponding to the set of spatial response functions. For each iteration of a plurality of iterations of an optimization process the method further includes generating a plurality of signal evolutions based at least on the MRF pulse sequence, each of the plurality of signal evolutions associated with a tissue type for the region of interest in the reference image, generating an undersampled image for each tissue type using the set of spatial response functions for the tissue type and the signal evolutions for the tissue type, combining the undersampled image for each tissue to create an undersampled image series, comparing the undersampled image series to an MRF dictionary to determine at least one quantitative parameter, generating a quantitative map for the at least one quantitative parameter, generating an undersampling error for the MRF pulse sequence by comparing the quantitative map and the reference image, performing an optimization based on the undersampling error and generating an updated MRF pulse sequence based on the optimization.

BRIEF DESCRIPTION OF THE DRAWINGS

The present invention will hereafter be described with reference to the accompanying drawings, wherein like reference numerals denote like elements.

DETAILED DESCRIPTION

Figure 1:
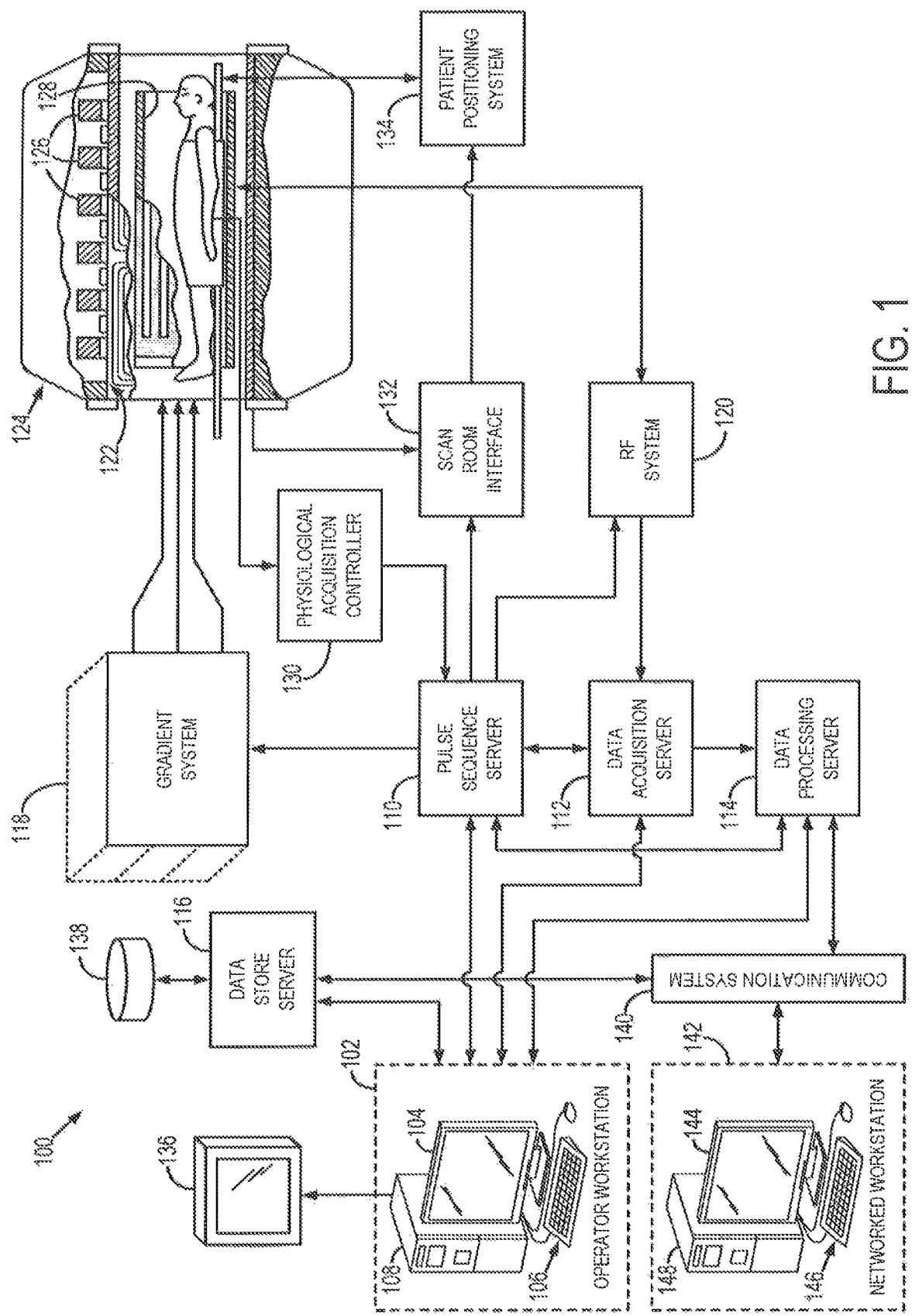
FIG. 1 is a schematic diagram of an example MRI system in accordance with an embodiment.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, tissue parameters or properties such as longitudinal relaxation time ($T_1$), transverse relaxation time ($T_2$), and proton density ($\rho$), and device dependent parameters such as main or static magnetic field map ($B_0$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical properties, such as those mentioned above. As an example, the comparison of the acquired signals to a dictionary can be performed using any suitable matching or pattern recognition technique. The properties for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative properties, which can be extracted from the selected signal vector and used to generate the relevant quantitative property maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; R(G) is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1,T_2,D, \ldots)$ or may include fewer terms, such as by not including the diffusion relaxation, as $E_i(T_1,T_2)$ or $E_i(T_1,T_2, \ldots)$. Also, the summation on "j" could be replace by a product on "j". The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

To achieve this process, a magnetic resonance imaging (MRI) system or nuclear magnetic resonance (NMR) system may be utilized. FIG. 1 shows an example of an MRI system 100 that may be used to perform magnetic resonance fingerprinting. In addition, MRI system 100 may be used to implement the methods described herein. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (3);$$

and the phase of the received magnetic resonance signal may also be determined according to the following relationship:

$$\varphi = \tan^{-1}\left(\frac{Q}{I}\right). \qquad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

The present disclosure describes a system and method for determining undersampling errors (or artifacts) for a magnetic resonance fingerprinting (MRF) pulse sequence. The disclosed systems and methods reduce the computational time for estimation of undersampling errors (or artifacts). Advantageously, the systems and methods underestimate undersampling artifacts directly in the image domain. In some embodiments, the undersampling errors are determined using a partially separable model where spatial response functions are generated separately from signal evolutions using two parallel processes. In one process, the spatial response functions that contain all static spatial information and non-uniform fast Fourier transform (NUFFT) calculations may be pre-calculated for a specific MRF pulse sequence to be evaluated. In the other process, signal evolutions in the temporal domain for the evaluated pulse sequence may be determined separately. Typically, the signal evolutions can vary with different acquisition parameters for the MRF pulse sequence. The spatial response functions may then be combined with the signal evolutions to provide an undersampled image series that can be used to create quantitative parameter maps by, for example, comparing the undersampled image series to an MRF dictionary. The quantitative parameter maps may then be evaluated to determine the undersampling error.

In some embodiments, the disclosed systems and methods provide a tool that can be used to evaluate the tolerance of the MRF sequence to undersampling before it is implemented on an MRI system. In some embodiments, the disclosed systems and methods may be used in an optimization process (e.g., an iterative optimization process) for an MRF pulse sequence. For example, the error determined by the disclosed system and method may be used an input and a cost function for the optimization process. Advantageously, because the spatial response functions can be generated (e.g. precomputed) once for a particular pulse sequence to be evaluated in a separate process from the signal evolutions, only the signal evolutions are re-evaluated for each iteration of the optimization which eliminates the need for repeated NUFFTs within the optimization iterations and accordingly, reduces computational time. Accordingly, NUFFT operators are only applied in the spatial domain to determine the spatial response functions, which is independent from the particular signal evolution. In a further advantage, the determination or estimation of the undersampling error is based on a predetermined number of tissue types for a region of interest. For example, for a brain region of interest, the determination of undersampling error may be based on three tissue types, white matter (WM), gray matter (GM) and cerebrospinal fluid (CSF). In an embodiment, the spatial response functions are generated using segmented tissue masks generated for each of the tissue types for the region of interest from a phantom image or map. As mentioned above, the time varying signal intensity (i.e., signal evolutions) is generated (or simulated) separately. In one embodiment, an over 100 times improvement in optimization speed was achieved using the disclosed method for estimating undersampling errors (or artifacts). In some embodiments, the system and method for determining undersampling errors may be applied in any MR application where rapid estimation of undersampling errors (or artifacts) is desired without using gridding or NUFFT.

Figure 2:
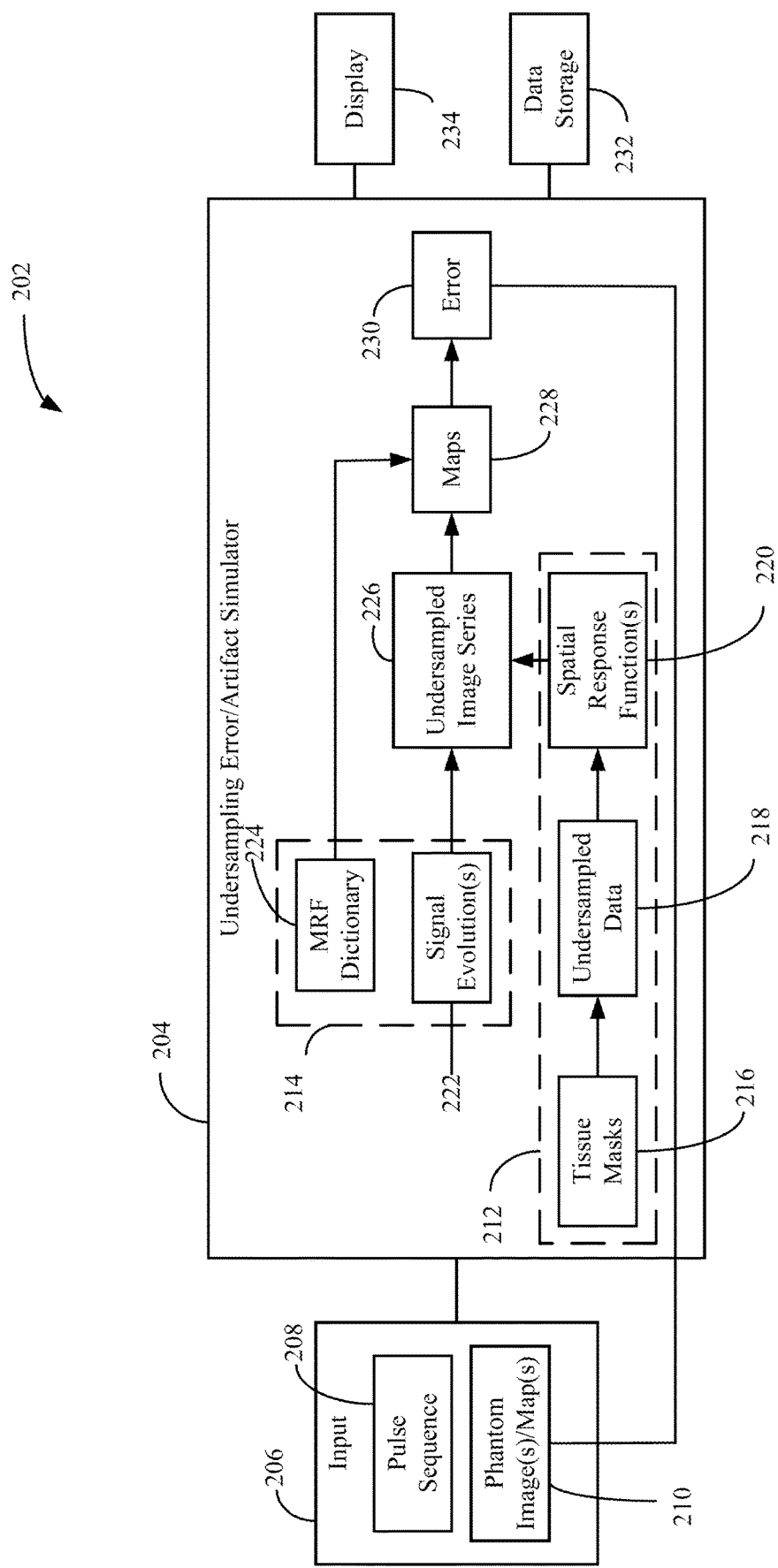
FIG. 2 is a block diagram of a system for determining undersampling errors for a magnetic resonance fingerprinting (MRF) pulse sequence in accordance with an embodiment.
Figure 3:
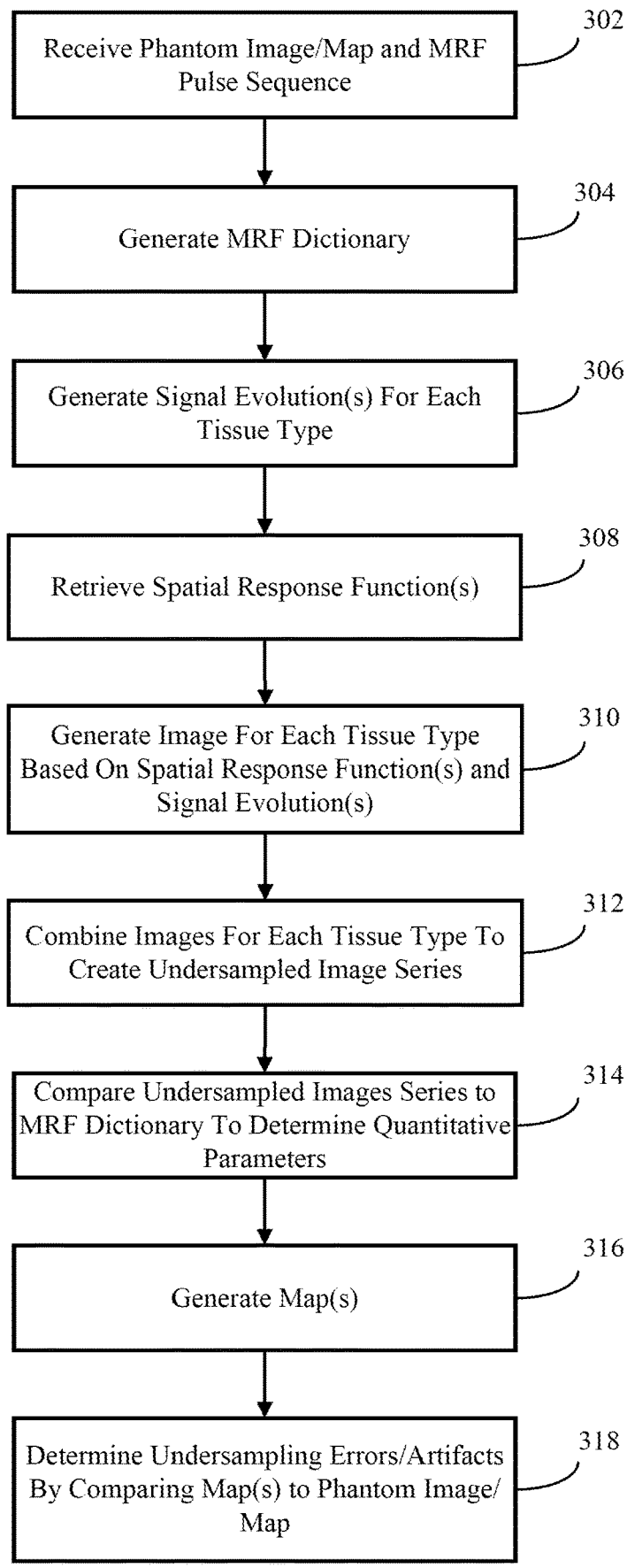
FIG. 3 illustrates a method for determining undersampling errors for an MRF pulse sequence in accordance with and embodiment.

FIG. 2 is a block diagram of a system for determining undersampling errors for a magnetic resonance fingerprinting (MRF) pulse sequence in accordance with an embodiment and FIG. 3 illustrates a method for determining undersampling errors for an MRF pulse sequence in accordance with and embodiment. Referring to FIG. 2, a system for determining undersampling errors for an MRF pulse sequence 202 includes an undersampling error/artifact simulator 204, an input 206, data storage 232 and a display 234. The undersampling error/artifact simulator 204 is configured to determine an undersampling error (or artifact) for an MRF pulse sequence. The simulator 204 receives as an input the MRF pulse sequence 208 and a phantom image or map 210. The MRF pulse sequence 208 is selected, for example, by a user, to be evaluated by the simulator 204 and may include a plurality of parameters including, but not limited to, RF pulses, gradient pulses, acquisition parameters such as flip angle, repetition time (TR), echo time (TE), matrix size, sampling pattern, etc. The phantom image or map 210 may be one or more existing images or maps for a predetermined region of interest (e.g., the brain) and predetermined quantified tissue properties (e.g., $T_1$ $T_2$, etc.). The phantom image or map 210 may be stored in and retrieved from memory or data storage 232, for example, data storage of the MRI system 100 shown in FIG. 1, or other computer system (e.g., compute system 700 shown in FIG. 7). In some embodiments, the phantom image or map 210 may have been generated from acquired MR data or simulated using known methods. The phantom image(s) or map(s) 210 may be used by the simulator 204 as a reference image (or map) and ground truth. In some embodiments, the phantom image or map 210 may be a phantom image or map of a brain of a subject quantifying $T_1$ and $T_{26}$. While the following description will be discussed in terms of embodiments using a brain phantom quantifying $T_1$ and $T_{26}$, it should be understood that in other embodiments phantom images of other regions of interest and tissue parameters may be used as the reference image input for the simulator 204. In an embodiment, the phantom image or map is selected to correspond to the region of interest and tissue properties associated with the MRF pulse sequence 208 to be evaluated by the simulator 204.

The simulator 204 includes a first process 212 to generate spatial response function(s) 220. The spatial response function(s) 220 are generated using tissue masks 216 created using the phantom image 210, and undersampled data 218 from the tissue masks 216 as described further below with respect to FIGS. 3 and 4. The spatial response function(s) 220 may be stored in memory or data storage 232. In a second parallel process, a set of signal evolutions 222 and an MRF dictionary 224 are generated using the pulse sequence and the Bloch equations as described further below with respect to FIG. 3. The signal evolutions 222 and MRF dictionary 224 may be stored in memory or data storage 232. As mentioned above, the spatial response functions 220 are advantageously generated separately from the signal evolutions 222. Accordingly, the spatial response functions 220 can be precomputed and do not need to be repeatedly generated for applications that require repeated determination of the undersampling error 230. The spatial response functions 220 may then be combined with the signal evolutions 222 to provide an undersampled image series 226 that can be used to create quantitative parameter maps 228 by, for example, comparing the undersampled image series 226 to the MRF dictionary 224. The undersampled image series 226 and quantitative parameter maps 228 may be generated, for example, using the method described further below with respect to FIG. 3. The quantitative parameter maps 228 may then be evaluated to determine the undersampling error 230. For example, in some embodiments, the undersampling error 230 may be determined by comparing the quantitative parameter maps 228 to the phantom image or map 210. In an embodiment, the determined undersampling error 230 may be stored in memory or data storage 232. In another embodiment, the determined undersampling error 230 may be provided to and displayed on a display 234, for example, a display 104, 136 or 144 of MRI system 100 shown in FIG. 1, or display 718 of computer system 700 shown in FIG. 7.

FIG. 3 illustrates a method for determining undersampling errors for an MRF pulse sequence in accordance with and embodiment. The method illustrated in FIG. 3 may be performed by the system 202 described above with respect to FIG. 2. At block 302, one or more phantom images or maps (e.g., phantom image(s)/maps 210) and an MRF pulse sequence (e.g. pulse sequence 208) are received via an input (e.g., input 206). As mentioned above, the phantom image or map may be retrieved from a memory or data storage, for example, data storage of the MRI system 100 shown in FIG. 1, or other computer system (e.g., compute system 700 shown in FIG. 7). In some embodiments, the phantom image or map may be one or more existing images or maps for a predetermined region of interest and predetermined quantified tissue properties. The phantom image or map may be used as a reference image or map and ground truth. In an example, the MRF pulse sequence is a sequence for quantifying $T_1$ and $T_2$ parameters for the brain and may be selected, for example, by a user, to be evaluated for undersampling errors. In this example, the phantom image or map is an image or map of a brain of a subject quantifying $T_1$ and $T_{26}$. At block 304, an MRF dictionary may be generated using the Bloch equations based on the MRF pulse sequence to simulate signal evolutions for different combinations of tissue parameters. For example, the MRF dictionary may include signal evolutions for all possible combinations of $T_1$ and $T_{26}$. In the example of a brain imaging MRF pulse sequence, the dictionary entries (i.e., signal evolutions) may be MRF dictionary. At block 306, one or more signal evolutions are generated for each tissue type associated with the region of interest of the phantom image or map. In an embodiment, the region of interest is the brain and there are three tissue types, namely, white matter (WM), gray matter (GM) and cerebrospinal fluid (CSF). Accordingly, in this example, a signal evolution is generated for each of the three tissue types and can be denoted by $d_{wm}(t)$, $d_{gm}(t)$, and $d_{csf}(t)$. In an embodiment, each signal evolution may be generated using the Bloch equations and known tissue property (e.g., $T_1$ and $T_2$) values (e.g., from the literature for each tissue type. For example, each signal evolution for each tissue type may be registered with relaxation times typical in a healthy human, namely, for (1) WM: $T_1$=800 ms, $T_2$=40 ms, (2) GM: T1=1400 ms, T2=60 ms, and (3) CSF: T1=3000 ms, T2=500 ms.

Figure 4:
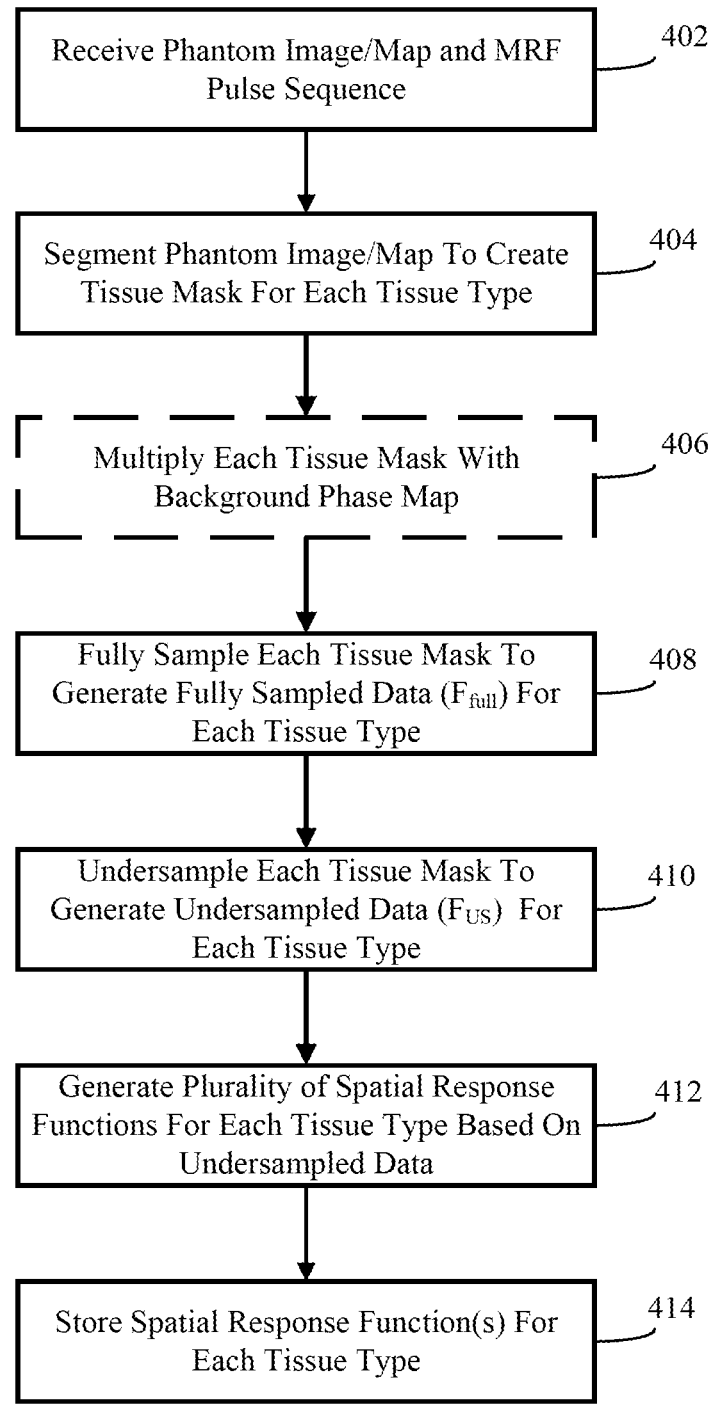
FIG. 4 illustrates a method for determining spatial response functions in accordance with an embodiment.

At block 308, a plurality of spatial response functions are retrieved, for example, from a memory or data storage. As mentioned above, the spatial response functions may be generated or pre-computed using a separate parallel process to the generation of the signal evolutions. FIG. 4 illustrates a method for determining spatial response functions in accordance with an embodiment. At block 402, the phantom images or maps (e.g., phantom image(s)/maps 210) and the MRF pulse sequence to be evaluated (e.g., pulse sequence (208) are received via an input (e.g., input 206) as described above with respect to block 302 of FIG. 3. At block 404, the phantom image or map is segmented into a plurality of tissue masks, where each tissue mask corresponds to a tissue type associated with the region of interest of the phantom image or map. For example, if the phantom image is of the brain, the phantom image may be segmented into three tissue masks, WM, GM and CSF. In some embodiments, background $B_O$ phase may optionally be added at block 406 to account for field variations and inhomogeneity. At block 406, background phase maps may be generated with a parabolic pattern ranging from $-\pi$ to $2\pi$ and each tissue mask may be multiplied to the phase maps in the spatial domain. At block 408, each tissue mask is fully sampled in k-space using a predetermined number of trajectories to generate fully sampled data (Fro), for example, spiral trajectories, radial trajectories, arbitrary trajectories, etc. For example, the MRF pulse sequence may have a sampling pattern where image at each time point are undersampled using one spiral arm out of a predetermined number of spiral trajectories (e.g., 48 spiral trajectories) and each tissue mask may be fully sampled at k-space using all of the variable density spiral trajectories. In an embodiment, NUFFT is applied to each tissue mask to generate the fully sampled data.

At block 410, each tissue mask is undersampled using the undersampling pattern of the input pulse sequences. In some embodiments, the undersampling pattern may utilize, for example, a spiral trajectory, radial trajectory, arbitrary trajectory, etc. For example, in an embodiment with 48 spiral trajectories, each tissue mask may be undersampled by sampling one of the spiral trajectories for acceleration to generate undersampled data ($F_{US}$) for each tissue mask. At block 412, a plurality of spatial response functions for each tissue type are generated based on the undersampled data ($F_{US}$) from block 410. In some embodiments, the spatial response functions may be generated by applying density compensation and inverse NUFFT to the undersampled k-space data for each tissue type to generate the spatial response functions for each tissue types. Each spatial response function may be a highly undersampled tissue mask. In an example with a sampling pattern of 48 spiral trajectories, 48 spatial response functions may be generated for each tissue type. The spatial response functions may be denoted as denoted $P_{wm}(x,y,S)$, $P_{gm}(x,y,S)$, $P_{csf}(x,y,S)$, and are functions of position (x,y) and spiral interleaf (or sampling pattern) S. For the example of a sampling pattern of 48 spiral trajectories the spiral interleaf is S=1 . . . 48. The spatial response functions describe the change of spatial distribution of each tissue segment as appears on an undersampled image, in response to the undersampling operation performed with a particular acquisition trajectory. In an embodiment, each spatial response function can be defined using the following equation:

$$P_{us\_i} = F_{us}^{-1} S_{us} F_{full}(P_i(x,y)) \quad (5)$$

At block 414, the generated spatial response functions for each tissue type may be stored in memory or data storage.

Returning to FIG. 3, at block 310, an image is generated for each tissue type based on the spatial response functions, $P_i$ (e.g., spatial response functions 220 in FIG. 2), for each tissue type retrieved at block 308 and the signal evolutions, $d_i t$ (e.g., signal evolutions 222 in FIG. 2), generated for each tissue type at block 306. In some embodiments, the reconstructed undersampled image for each tissue type may be determined by computing the direct product of the linearly ordered spatial response functions and the time-varying signal evolutions. For example, the undersampled may be calculated as:

$$I_{us}(x,y,t) = F_{us}^{-1} S_{us} F_{full}(I_{full}) = \Sigma_{i=1} \ldots F_{us}^{-1} S_{us} F_{full}(P_i(x,y)) d_i(t) \quad (6)$$

where $F_{full}$ and $F_{us}^{-1}$ are fully sampled and undersampled NUFFT, $S_{us}$ is the undersampling pattern, J is the number of tissue types, $P_i(x,y)$ is the spatial response function with the probability of each pixel belonging to tissue class i, and $d_i(t)$ is the signal intensity in time for tissue i. As mentioned above, in the disclosed undersampling error determination framework NUFFT operators are only applied in the spatial domain to determine the spatial response functions, which is independent from the particular signal evolution. At block 312, the undersampled images generated for each tissue type are combined to create an undersampled image series (e.g., undersampled image series 226 in FIG. 2). In an embodiment, the undersampled images for each tissue type may be linearly combined to yield a series of aliased images as a function of time.

At block 314, the undersampled image series generated at block 312 is compared to an MRF dictionary to match the images with the signal evolutions stored in the MRF dictionary and determine one or more quantitative parameters (e.g., tissue properties such as $T_1$, $T_2$, etc.) associated with the matching dictionary entry or entries (i.e., matching signal evolution(s)). Comparing the images from block 312 to the MRF dictionary may be performed in a number of ways such as, for example, using a pattern matching, template matching, or other matching algorithm. At block 316, a quantitative map may be generated for each identified quantitative parameter. The identified quantitative parameters and quantitative parameter maps may be stored in memory or data storage (e.g., data storage 232 shown in FIG. 2). At block 318, undersampling error or artifacts may be generated by comparing the quantitative parameter maps from block 316 to the reference (or ground truth) phantom image or map. The quantitative parameter maps and the reference phantom image or map may be compared using known methods.

Figure 5:
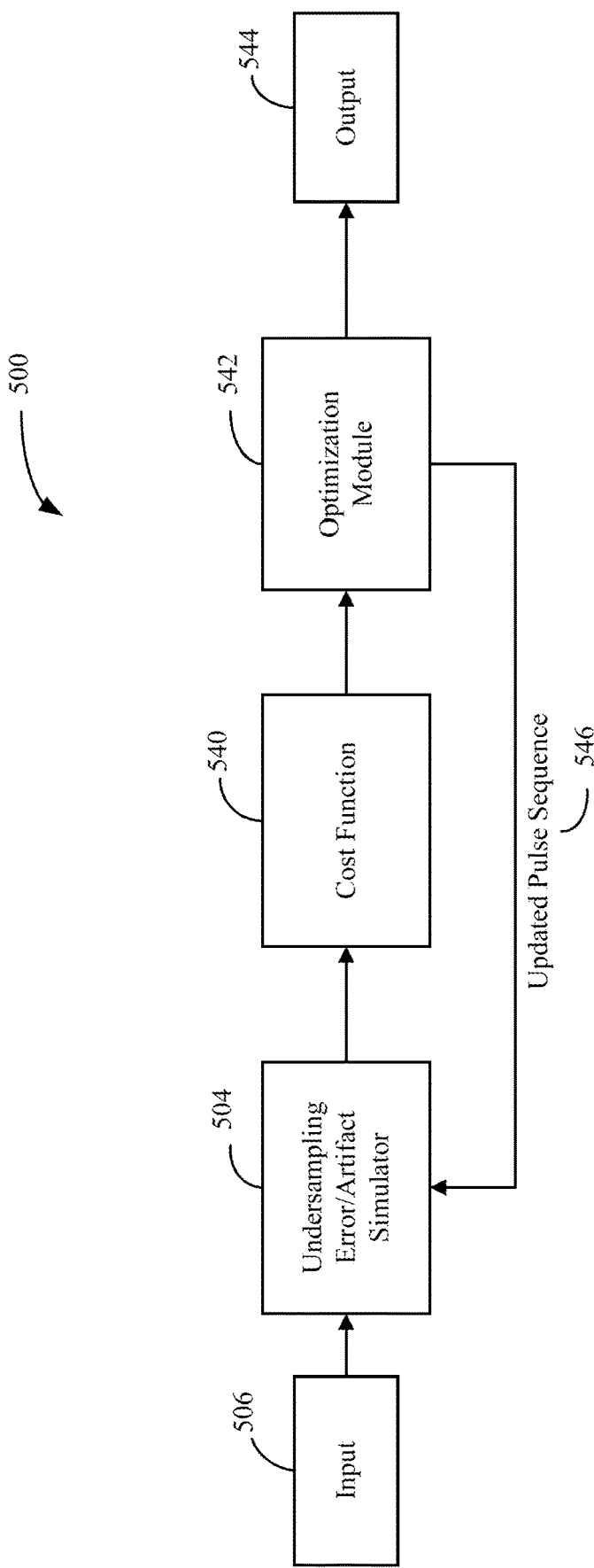
FIG. 5 is a block diagram of a system for optimizing an MRF pulse sequence based on undersampling errors in accordance with an embodiment.
Figure 6:
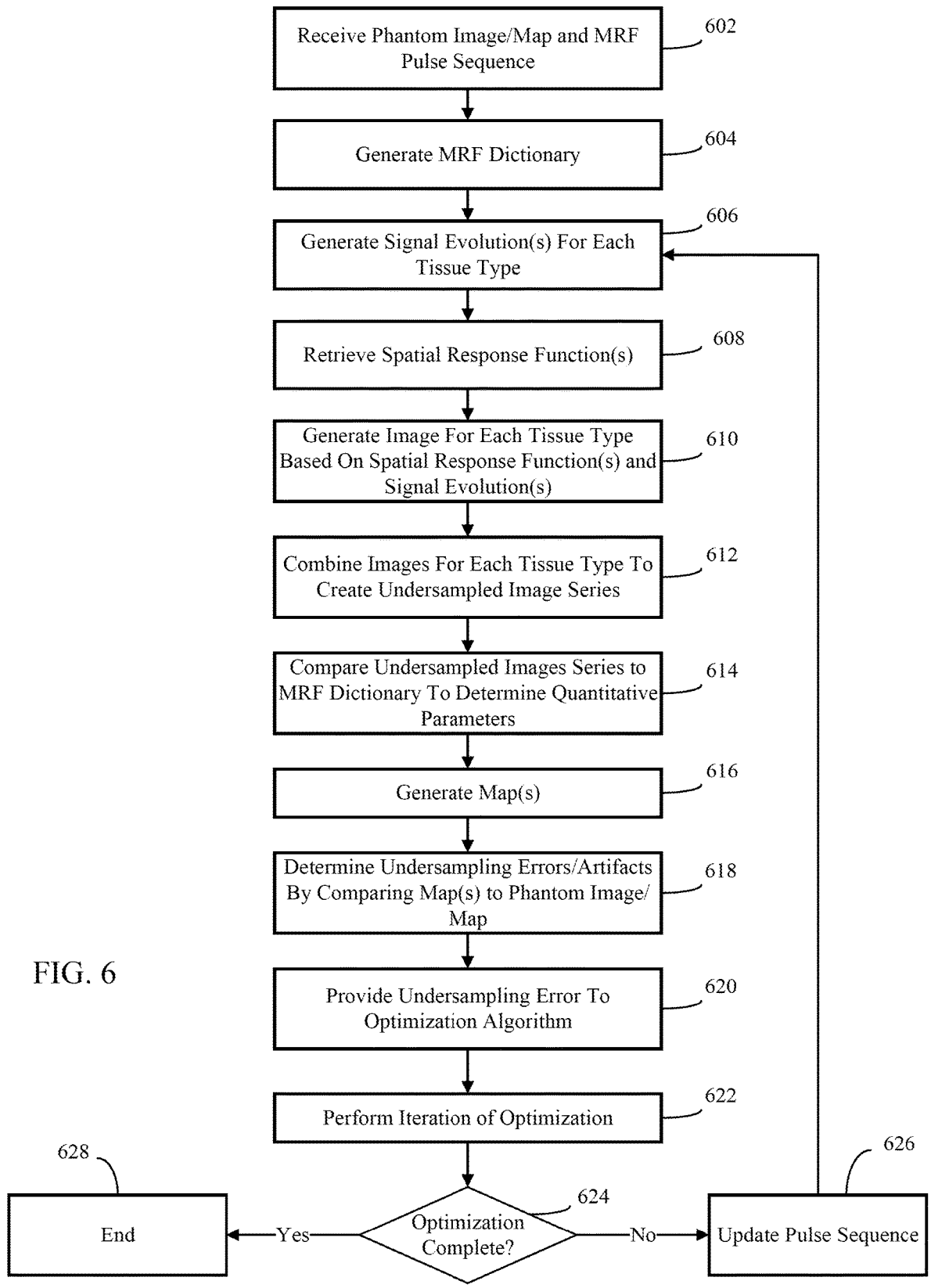
FIG. 6 illustrates a method for optimizing an MRF pulse sequence based on undersampling errors in accordance with an embodiment.

As mentioned, the system and method for determining undersampling errors for an MRF pulse sequence can be used in an optimization process for the MRF pulse sequence. FIG. 5 is a block diagram of a system for optimizing an MRF pulse sequence based on undersampling errors in accordance with an embodiment and FIG. 6 illustrates a method for optimizing an MRF pulse sequence based on undersampling errors in accordance with an embodiment. Referring to FIG. 5, a system for optimizing an MF pulse sequence includes an undersampling error/artifact simulator 504, an input 506, a cost function, and an optimization module. The undersampling error/artifact simulator 504 is configured to determine an undersampling error (or artifact) for an MRF pulse sequence. The undersampling error/artifact simulator 504 may be, for example, the undersampling error/artifact simulator 202 described above with respect to FIG. 2. The simulator 504 receives as an input, for example, an MRF pulse sequence to be optimized and a reference phantom image or map. The simulator 506 determines an undersampling error for the input MRF pulse sequence, for example, in the manner described above with respect to FIG. 3. The determined undersampling error may then be used by the cost function 540 as a metric of accuracy (or quality metric) for the current MRF pulse sequence (e.g., the initial input 506 MRF pulse sequence or an updated pulse sequence 546. In an embodiment, the optimization module 542 may perform an optimization algorithm configured to minimize the undersampling error. Based on the metric of accuracy feedback from the cost function 540, the optimization module 542 generates an updated pulse sequence (e.g., updated pulse sequence parameters such as acquisition parameters) which is provided to the simulator 504. The simulator determines the undersampling error of the updated pulse sequence 546 which is provided as a metric of accuracy to the optimization module 542. As discussed further below with respect to FIG. 6, the cycle of updating the pulse sequence and determining the undersampling error may be repeated until a sufficient (or minimized) undersampling error is reached. In one embodiment, the optimization iterations may be repeated for a predetermined and fixed number of iterations. The best pulse sequence (and its associated parameters) with the best undersampling error found during the optimization process may be selected and provided as a final output 544 as the optimized MRF pulse sequence. As mentioned above, the undersampling error/artifact simulator 405 is advantageously configured to reduce computational time as described above with respect to FIGS. 2 and 3 by for example, precomputing spatial response functions once in a separate process for a particular pulse sequence to be evaluated. Accordingly, only the signal evolutions are re-evaluated for each iteration of the optimization which eliminates the need for repeated NUFFTs within the optimization iterations. The optimized MRF pulse sequence may be stored in memory or data storage, for example, data storage of the MRI system 100 shown in FIG. 1, or other computer system (e.g., compute system 700 shown in FIG. 7). In another embodiment, the optimized pulse sequence may be provided to and displayed on a display, for example, a display 104, 136 or 144 of MRI system 100 shown in FIG. 1, or display 718 of computer system 700 shown in FIG. 7. In some embodiments, the optimized pulse sequence may be provided to an MRI system (e.g., MRI system 100 shown in FIG. 1) to perform an MRF scan of a subject using the optimized MRF pulse sequence.

FIG. 6 illustrates a method for optimizing an MRF pulse sequence based on undersampling errors in accordance with an embodiment. The method illustrated in FIG. 6 may be performed by the system 500 described above with respect to FIG. 5. Blocks 602-618 describe a method for determining undersampling error for an MRF pulse sequence and may correspond to blocks 302-318 of FIG. 3 and be performed in the same manner as described above with respect to blocks 302-318 of FIG. 3. As mentioned above, in some embodiments the disclosed method of blocks 602-618 (and blocks 302-318 of FIG. 3) advantageously determines the undersampling errors using a partially separable model where spatial response functions are generated separately from signal evolutions using two parallel processes. The spatial response functions (block 608) contain all static spatial information and non-uniform fast Fourier transform (NUFFT) calculations and may be pre-calculated as described above with respect to FIG. 4 for a specific MRF pulse sequence to be evaluated. Signal evolutions (block 606) in the temporal domain for the evaluated pulse sequence may be determined separately.

At block 620, the determined undersampling error may be provided to an optimization algorithm and may be used to, for example, provide a metric of accuracy that may be minimized by the optimization algorithm and an associated cost function. At block 222, the optimization algorithm performs an iteration of the optimization based on the undersampling error. In an embodiment, the optimization algorithm may generate an updated pulse (e.g., updated pulse sequence parameters such as acquisition parameters) at bock 622. At block 624 it is determined if the optimization process is complete. For example, the cycle of updating the pulse sequence and determining the undersampling error may be repeated until a sufficient (or minimized) undersampling error is reached. In one embodiment, the optimization iterations may be repeated for a predetermined and fixed number of iterations. If the process is not complete at block 624, the optimization algorithm provides an updated pulse sequence 626 and the process returns to block 606. The updated pule sequence is then evaluated for undersampling error using the process of blocks 606-618. Advantageously, the spatial response functions do not need to be generated for the updated pulse sequence, rather, the pre-calculated spatial response functions may be retrieved at block 608 and used in each iteration of the optimization. Accordingly, the spatial response functions are not re-evaluated for each iteration of the optimization which eliminates the need for repeated NUFFTs within the optimization iterations and advantageously reduces computational time. The undersampling error determined for the updated pulse sequence is then provided to the optimization algorithm at block 620 and another iteration of the optimization is performed at block 622. If the optimization process is complete at block 624, the process ends at bock 628. In an embodiment, the best pulse sequence (and its associated parameters) with the best undersampling error found during the optimization process may be selected and provided as a final output as the optimized MRF pulse sequence. The optimized MRF pulse sequence may be stored in memory or data storage, for example, data storage of the MRI system 100 shown in FIG. 1, or other computer system (e.g., compute system 700 shown in FIG. 7). In another embodiment, the optimized pulse sequence may be provided to and displayed on a display, for example, a display 104, 136 or 144 of MRI system 100 shown in FIG. 1, or display 718 of computer system 700 shown in FIG. 7. In some embodiments, the optimized pulse sequence may be provided to an MRI system (e.g., MRI system 100 shown in FIG. 1) to perform an MRF scan of a subject using the optimized MRF pulse sequence.

Figure 7:
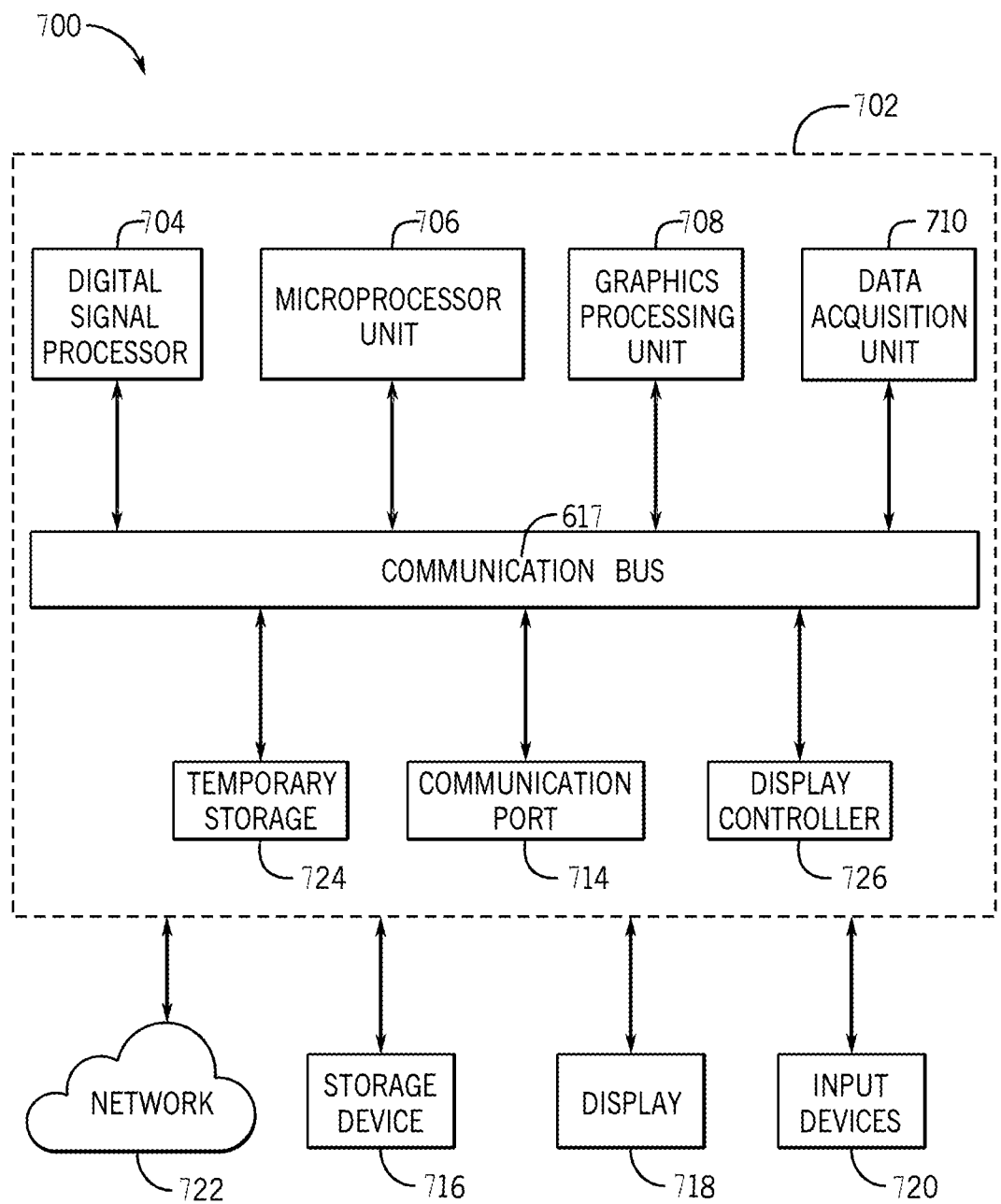
FIG. 7 is a block diagram of an example computer system in accordance with an embodiment.

The system and methods described above with respect to FIGS. 2-6 can be implemented on an MRI system, for example, using processor 108 or 148 of the MRI system 100 shown in FIG. 1 or on a separate computer system. FIG. 7 is a block diagram of an example computer system in accordance with an embodiment. Computer system 700 may be used to implement the systems and methods described herein. In some embodiments, the computer system 700 may be a workstation, a notebook computer, a tablet device, a mobile device, a multimedia device, a network server, a mainframe, one or more controllers, one or more microcontrollers, or any other general-purpose or application-specific computing device. The computer system 700 may operate autonomously or semi-autonomously, or may read executable software instructions from the memory or storage device 716 or a computer-readable medium (e.g., a hard drive, a CD-ROM, flash memory), or may receive instructions via the input device 722 from a user, or any other source logically connected to a computer or device, such as another networked computer or server. Thus, in some embodiments, the computer system 700 can also include any suitable device for reading computer-readable storage media.

Data may be provided to the computer system 700 from a data storage device 716, and these data are received in a processing unit 702. In some embodiment, the processing unit 702 includes one or more processors. For example, the processing unit 702 may include one or more of a digital signal processor (DSP) 704, a microprocessor unit (MPU) 706, and a graphics processing unit (GPU) 708. The processing unit 702 also includes a data acquisition unit 710 that is configured to electronically receive data to be processed. The DSP 704, MPU 706, GPU 708, and data acquisition unit 710 are all coupled to a communication bus 712. The communication bus 712 may be, for example, a group of wires, or a hardware used for switching data between the peripherals or between any component in the processing unit 702.

The DSP 704 may be configured to implement the systems and methods described here. The MPU 706 and GPU 708 may also be configured to implement the systems and methods described here in conjunction with the DSP 704. For example, the MPU 706 may be configured to control the operation of components in the processing unit 702 and can include instructions to implement the systems and methods described in the present disclosure, including, as described above, on the DSP 704 and/or the GPU 708.

The processing unit 702 may also include a communication port 714 in electronic communication with other devices, which may include a storage device 716, a display 718, and one or more input devices 720. Examples of an input device 720 include, but are not limited to, a keyboard, a mouse, and a touch screen through which a user can provide an input. The storage device 716 may be configured to store data, which may include data acquired with an MRI system, magnetic resonance images, calculated contrast concentration curves, estimated quantitative parameters, and/or quantitative parameters maps, whether these data are provided to, or processed by, the processing unit 702. The display 718 may be used to display images and other information, such as magnetic resonance images, patient health data, and so on.

The processing unit 702 can also be in electronic communication with a network 722 to transmit and receive data and other information. The communication port 714 can also be coupled to the processing unit 702 through a switched central resource, for example the communication bus 712. The processing unit can also include temporary storage 724 and a display controller 726. The temporary storage 724 is configured to store temporary information. For example, the temporary storage 724 can be a random access memory.

Computer-executable instructions for determining undersampling errors for an MRF pulse sequence and optimizing an MRF pulse sequence based on undersampling errors according to the above-described systems and methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly states, are possible and within the scope of the invention.

The invention claimed is:

1. A method for determining an undersampling error for a magnetic resonance fingerprinting (MRF) pulse sequence, the method comprising:
   retrieving, from data storage, a plurality of sets of spatial response functions, wherein each set of spatial response functions is associated with a tissue type in a region of interest of a reference image and each set of spatial response functions is based on a tissue mask of the reference image associated with the tissue type corresponding to the set of spatial response functions;
   generating a plurality of signal evolutions based at least on the MRF pulse sequence, each of the plurality of signal evolutions associated with a tissue type for the region of interest in the reference image;
   generating an undersampled image for each tissue type using the set of spatial response functions for the tissue type and the signal evolutions for the tissue type;
   combining the undersampled image for each tissue type to create an undersampled image series;
   comparing the undersampled image series to an MRF dictionary to determine at least one quantitative parameter;
   generating a quantitative map for the at least one quantitative parameter; and
   generating an undersampling error for the MRF pulse sequence by comparing the quantitative map and the reference image.

2. The method according to claim 1, wherein the tissue mask is generated by segmenting the reference image based on tissue type.

3. The method according to claim 1, wherein the tissue mask is configured to include a background $B_0$ phase.

4. The method according to claim 1, wherein each spatial response function in the plurality of sets of spatial response functions may be given by:

$$P_{us\_i} = F_{us}^{-1} S_{us} F_{full}(P_i(x,y)).$$

5. The method according to claim 1, wherein generating the plurality of signal evolutions comprises simulating the plurality of signal evolutions using Bloch equations and predetermined tissue properties.

6. The method according to claim 1, wherein generating an undersampled image for each tissue type using the set of spatial response functions for the tissue type and the signal evolutions for the tissue type is given by:

$$I_{us}(x,y,t) = F_{us}^{-1} S_{us} F_{full}(I_{full}) = \Sigma_{i=1} \ldots {}_J F_{us}^{-1} S_{us} F_{full}(P_i(x,y)) d_i(t);$$

where $F_{full}$ is fully sampled data, $F_{us}^{-1}$ undersampled data, $S_{us}$ is an undersampling pattern for the MRF pulse sequence, J is a number of tissue types, $P_i(x,y)$ is the spatial response function with the probability of each pixel belonging to tissue type i, and $d_i(t)$ is the signal evolution in time for tissue i.

7. A system for determining an undersampling error for a magnetic resonance fingerprinting (MRF) pulse sequence comprises:
   an input configured to receive the MRF pulse sequence and a reference image;
   an undersampling error simulator coupled to the input and configured to:
      receive the MRF pulse sequence and reference image;
      retrieve a plurality of sets of spatial response functions, wherein each set of spatial response functions is associated with a tissue type in a region of interest of the reference image and each set of spatial response functions is based on a tissue mask of the reference image associated with the tissue type corresponding to the set of spatial response functions;
      generate a plurality of signal evolutions based at least on the MRF pulse sequence, each of the plurality of signal evolutions associated with a tissue type for the region of interest in the reference image;
      generate an undersampled image for each tissue type using the set of spatial response functions for the tissue type and the signal evolutions for the tissue type;
      combine the undersampled image for each tissue to create an undersampled image series;
      compare the undersampled image series to an MRF dictionary to determine at least one quantitative parameter;
      generate a quantitative map for the at least one quantitative parameter; and
      generate an undersampling error for the MRF pulse sequence by comparing the quantitative map and the reference image; and
   a display coupled to the undersampling error simulator and configured to display the undersampling error.

8. The system according to claim 7, wherein each spatial response function in the plurality of sets of spatial response functions may be given by:

$$P_{us\_i}=F_{us}^{-1}S_{us}F_{full}(P_i(x,y)).$$

9. The system according to claim 7, wherein the undersampling error simulator is further configured to generate the undersampled image for each tissue type using:

$$I_{us}(x,y,t)=F_{us}^{-1}S_{us}F_{full}(I_{full})=\Sigma_{i=1}\ldots _jF_{us}^{-1}S_{us}F_{full}(P_i(x,y))d_i(t);$$

where $F_{full}$ is fully sampled data, $F_{us}^{-1}$ undersampled data, $S_{us}$ is an undersampling pattern for the MRF pulse sequence, J is a number of tissue types, $P_i(x,y)$ is the spatial response function with the probability of each pixel belonging to tissue type i, and $d_i(t)$ is the signal evolution in time for tissue i.

10. The system according to claim 7, wherein the tissue mask is generated by segmenting the reference image based on tissue type.

11. The system according to claim 7, wherein the tissue mask is configured to include a background $B_0$ phase.

12. A method for optimizing a magnetic resonance fingerprinting (MRF) pulse sequence, the method comprising:
retrieving, from data storage, a plurality of sets of spatial response functions, wherein each set of spatial response functions is associated with a tissue type in a region of interest of a reference image and each set of spatial response functions is based on a tissue mask of the reference image associated with the tissue type corresponding to the set of spatial response functions;
for each iteration of a plurality of iterations of an optimization process:
generating a plurality of signal evolutions based at least on the MRF pulse sequence, each of the plurality of signal evolutions associated with a tissue type for the region of interest in the reference image;
generating an undersampled image for each tissue type using the set of spatial response functions for the tissue type and the signal evolutions for the tissue type;
combining the undersampled image for each tissue to create an undersampled image series;
comparing the undersampled image series to an MRF dictionary to determine at least one quantitative parameter;
generating a quantitative map for the at least one quantitative parameter;
generating an undersampling error for the MRF pulse sequence by comparing the quantitative map and the reference image;
performing an optimization based on the undersampling error; and
generating an updated MRF pulse sequence based on the optimization.

13. The method according to claim 12, further comprising selecting an optimized MRF pulse sequence based on each updated MRF pulse sequence generated for each iteration.

14. The method according to claim 12, wherein the undersampling error is a cost function for the optimization process.

15. The method according to claim 12, wherein the region of interest is a brain.

16. The method according to claim 15, wherein the tissue type includes white matter, gray matter and cerebrospinal fluid.

17. The method according to claim 12, wherein each spatial response function in the plurality of sets of spatial response functions may be given by:

$$P_{us\_i}=F_{us}^{-1}S_{us}F_{full}(P_i(x,y)).$$

18. The method according to claim 12, wherein generating an undersampled image for each tissue type using the set of spatial response functions for the tissue type and the signal evolutions for the tissue type is given by:

$$I_{us}(x,y,t)=F_{us}^{-1}S_{us}F_{full}(I_{full})=\Sigma_{i=1}\ldots _jF_{us}^{-1}S_{us}F_{full}(P_i(x,y))d_i(t);$$

where $F_{full}$ is fully sampled data, $F_{us}^{-1}$ undersampled data, $S_{us}$ is an undersampling pattern for the MRF pulse sequence, J is a number of tissue types, $P_i(x,y)$ is the spatial response function with the probability of each pixel belonging to tissue type i, and $d_i(t)$ is the signal evolution in time for tissue i.

* * * * *